United States Patent
Kim et al.

(10) Patent No.: US 9,825,217 B1
(45) Date of Patent: Nov. 21, 2017

(54) MAGNETIC MEMORY DEVICE HAVING COBALT-IRON-BERYLLIUM MAGNETIC LAYERS

(71) Applicant: Samsung Electronics Co., Ltd., Suwon-si, Gyeonggi-do (KR)

(72) Inventors: Woojin Kim, Yongin-si (KR); Keewon Kim, Suwon-si (KR); S. P. Stuart Parkin, San Jose, CA (US); Jaewoo Jeong, San Jose, CA (US); Mahesh Govind Samant, San Jose, CA (US)

(73) Assignees: Samsung Electronics Co., Ltd., Gyeonggi-Do (KR); International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/360,221

(22) Filed: Nov. 23, 2016

Related U.S. Application Data

(63) Continuation-in-part of application No. 15/157,717, filed on May 18, 2016.

(51) Int. Cl.
- *H01L 43/02* (2006.01)
- *H01L 43/08* (2006.01)
- *H01L 43/10* (2006.01)
- *H01F 10/32* (2006.01)
- *H01L 43/12* (2006.01)

(52) U.S. Cl.
CPC ......... *H01L 43/02* (2013.01); *H01F 10/3218* (2013.01); *H01L 43/08* (2013.01); *H01L 43/10* (2013.01); *H01L 43/12* (2013.01)

(58) Field of Classification Search
CPC ......... H01L 43/02; H01L 43/08; H01L 43/10; H01L 43/12; H01F 10/3218
See application file for complete search history.

(56) References Cited

U.S. PATENT DOCUMENTS

| | | | |
|---|---|---|---|
| 6,028,786 A | 2/2000 | Nishimura | |
| 6,348,274 B1 | 2/2002 | Kamiguchi et al. | |
| 6,815,745 B2 | 11/2004 | Higo et al. | |
| 6,816,347 B2 | 11/2004 | Koi et al. | |
| 6,850,433 B2* | 2/2005 | Sharma | B82Y 25/00 365/171 |
| 7,453,412 B2* | 11/2008 | Murali | H01Q 1/36 343/700 MS |
| 7,596,015 B2 | 9/2009 | Kitagawa et al. | |
| 7,852,667 B2 | 12/2010 | Lou | |

(Continued)

FOREIGN PATENT DOCUMENTS

JP        5104753 B2    12/2012

*Primary Examiner* — Ida M Soward

(74) *Attorney, Agent, or Firm* — Harness, Dickey & Pierce P.L.C.

(57) ABSTRACT

Example embodiments relate to magnetic memory devices and methods for manufacturing the same. The magnetic memory device includes a magnetic tunnel junction layer including a first magnetic layer, a second magnetic layer, and a first tunnel barrier layer between the first and second magnetic layers. The second magnetic layer is disposed on the first tunnel barrier layer and is in direct contact with the first tunnel barrier layer. The second magnetic layer includes cobalt-iron-beryllium (CoFeBe). A beryllium content of CoFeBe in the second magnetic layer ranges from about 2 at % to about 15 at %.

20 Claims, 15 Drawing Sheets

(56) References Cited

U.S. PATENT DOCUMENTS

| | | | |
|---|---|---|---|
| 8,008,740 B2 | 8/2011 | Zhao et al. | |
| 8,208,231 B2 * | 6/2012 | Nishimura | B82Y 10/00 360/324.2 |
| 8,959,250 B2 * | 2/2015 | Lee | H01L 43/08 710/11 |
| 9,136,464 B1 * | 9/2015 | Whig | H01L 43/12 |
| 2006/0130193 A1 * | 6/2006 | Roy | G01R 33/06 257/421 |
| 2008/0049488 A1 * | 2/2008 | Rizzo | G11C 11/16 365/158 |
| 2009/0141409 A1 * | 6/2009 | Santos | H01L 29/0843 360/324.2 |
| 2010/0028530 A1 * | 2/2010 | Parkin | B82Y 10/00 427/130 |
| 2010/0148167 A1 * | 6/2010 | Whig | B82Y 25/00 257/43 |
| 2010/0157664 A1 * | 6/2010 | Chung | G11C 11/16 365/158 |
| 2011/0318848 A1 * | 12/2011 | Choi | B82Y 25/00 438/3 |
| 2012/0061780 A1 * | 3/2012 | Uchida | G11C 11/16 257/421 |
| 2012/0086089 A1 * | 4/2012 | Li | H01L 43/12 257/421 |
| 2012/0106245 A1 * | 5/2012 | Mackay | G11C 11/16 365/173 |
| 2013/0130406 A1 * | 5/2013 | Zhu | B82Y 25/00 438/3 |
| 2014/0048893 A1 | 2/2014 | Wu et al. | |
| 2015/0123223 A1 | 5/2015 | Kim et al. | |
| 2015/0200353 A1 * | 7/2015 | Zhang | H01L 43/12 257/421 |
| 2016/0118578 A1 * | 4/2016 | Park | H01L 43/12 438/3 |
| 2016/0225981 A1 * | 8/2016 | Deshpande | H01L 43/08 |
| 2017/0069367 A1 * | 3/2017 | Ohki | G11C 11/1659 |

* cited by examiner

US 9,825,217 B1

MAGNETIC MEMORY DEVICE HAVING COBALT-IRON-BERYLLIUM MAGNETIC LAYERS

CROSS-REFERENCE TO RELATED APPLICATIONS

This application is a continuation-in-part application of U.S. patent application Ser. No. 15/157,717, filed on May 18, 2016, the entire contents of which are incorporated herein by reference.

BACKGROUND

Embodiments of the inventive concepts relate to semiconductor devices, and/or to methods of manufacturing the same. More particularly, embodiments of the inventive concepts relate to magnetic memory devices and/or to methods of manufacturing the same.

Semiconductor devices are widely used in the electronics industry because of their small sizes, multi-functional characteristics, and/or low manufacture costs. Semiconductor memory devices, among the semiconductor devices may also store logical data. Magnetic memory devices, among the semiconductor memory devices are spotlighted as the next-generation of semiconductor memory devices because of their high-speed and/or non-volatile characteristics.

Generally, a magnetic memory device may include a magnetic tunnel junction (MTJ) pattern. The MTJ pattern may include two magnetic layers and an insulating layer disposed between the two magnetic layers. A resistance value of the MTJ pattern may be changed depending on magnetization directions of the two magnetic layers. For example, if the magnetization directions of the two magnetic layers are substantially anti-parallel to each other, the MTJ pattern may exhibit a relatively large electrical resistance. On the contrary, if the magnetization directions of the two magnetic layers are substantially parallel to each other, the MTJ pattern may exhibit a relatively small electrical resistance. Logical data may be stored into and/or read out from the MTJ pattern by using a difference between these resistance values.

SUMMARY

Embodiments of the inventive concepts relate to magnetic memory devices having improved reliability and a low switching current.

Embodiments of the inventive concepts relate to methods of manufacturing a magnetic memory device having improved reliability and a low switching current.

In an example embodiment, a magnetic memory device may include a magnetic tunnel junction layer including a first magnetic layer, a second magnetic layer, and a first tunnel barrier layer between the first and second magnetic layers. The first magnetic layer may be in direct contact with the first tunnel barrier layer. The first magnetic layer may include $(Co_xFe_{100-x})_{100-z}Be_z$ where "x" is in a range of 40 to 60 and "z" is in a range of 2 to 15.

In an example embodiment, a magnetic memory device may include a magnetic tunnel junction layer including a first magnetic layer, a second magnetic layer, and a first tunnel barrier layer between the first and second magnetic layers. The first magnetic layer and the second magnetic layer may be in direct contact with a bottom surface and a top surface of the first tunnel barrier layer, respectively. Each of the first and second magnetic layers may include cobalt-iron-beryllium (CoFeBe). A ratio of a cobalt content to an iron content in the first magnetic layer may be different from a ratio of a cobalt content to an iron content in the second magnetic layer.

In example embodiments, a magnetic memory device may include a substrate, and a magnetic tunnel junction layer on the substrate. The magnetic tunnel junction layer may include a free magnetic layer, a pinned magnetic layer, and a tunnel barrier layer between the free magnetic layer and the pinned magnetic layer. The free magnetic layer may be disposed between the substrate and the tunnel barrier layer and may be in direct contact with a bottom surface of the tunnel barrier layer. The pinned magnetic layer may be in direct contact with a top surface of the tunnel barrier layer. Each of the free and pinned magnetic layers may include cobalt-iron-beryllium (CoFeBe).

BRIEF DESCRIPTION OF THE DRAWINGS

The inventive concepts will become more apparent in view of the attached drawings and accompanying detailed description.

DETAILED DESCRIPTION OF THE EMBODIMENTS

Figure 1:
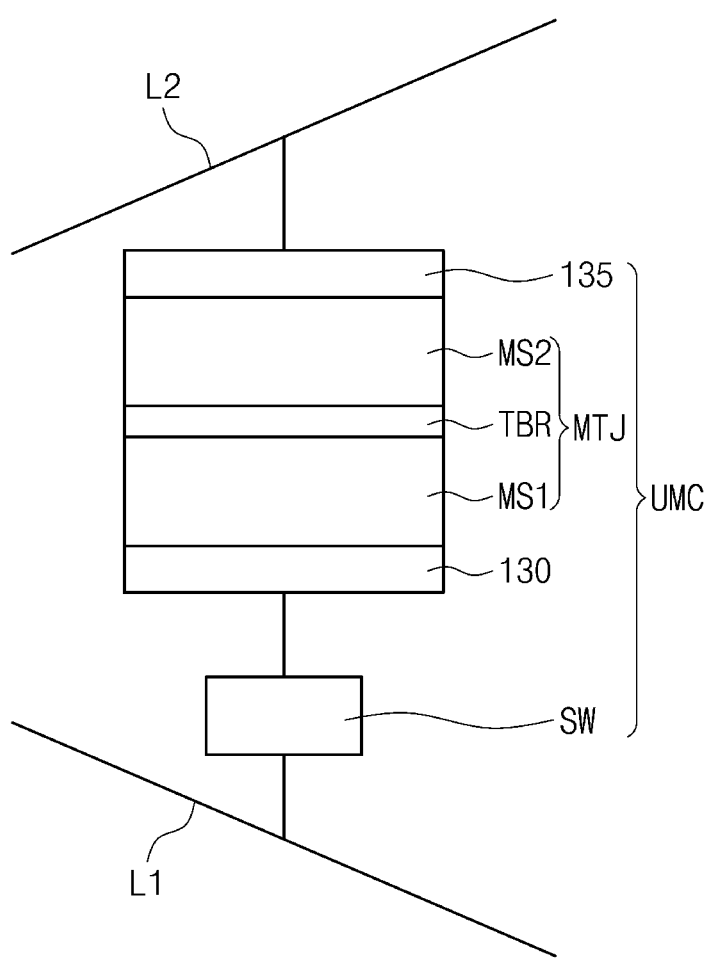
FIG. 1 is a circuit diagram illustrating a unit memory cell of a magnetic memory device, according to example embodiments of the inventive concepts.

The inventive concepts will now be described more fully hereinafter with reference to the accompanying drawings, in which example embodiments of the inventive concepts are shown. The advantages and features of the inventive concepts and methods of achieving them will be apparent from the following example embodiments that will be described in more detail with reference to the accompanying drawings. It should be noted, however, that the inventive concepts are not limited to the following example embodiments, and may be implemented in various forms. Accordingly, the example embodiments are provided only to disclose the inventive concepts and let those skilled in the art know the category of the inventive concepts. In the drawings, embodiments of the inventive concepts are not limited to the specific examples provided herein and are exaggerated for clarity. As used herein, the term "and/or" includes any and all combinations of one or more of the associated listed items.

Additionally, it will be understood that when an element is referred to as being "on," "connected" or "coupled" to another element, it can be directly on, connected or coupled to the other element or intervening elements may be present. In contrast, when an element is referred to as being "directly on," "directly connected" or "directly coupled" to another element, there are no intervening elements present. As used herein the term "and/or" includes any and all combinations of one or more of the associated listed items. Further, it will be understood that when a layer is referred to as being "under" another layer, it can be directly under or one or more intervening layers may also be present. In addition, it will also be understood that when a layer is referred to as being "between" two layers, it can be the only layer between the two layers, or one or more intervening layers may also be present.

Moreover, example embodiments are described herein with reference to cross-sectional views and/or plan views that are idealized example views. In the drawings, the dimensions of layers and regions are exaggerated for clarity. Accordingly, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments. It will be also understood that although the terms first, second, third etc. may be used herein to describe various elements, components, regions, layers and/or sections, these elements, components, regions, layers and/or sections should not be limited by these terms. These terms are only used to distinguish one element from another element. Thus, a first element, component, region, layer or section discussed below in some embodiments could be termed a second element, component, region, layer or section discussed below in other embodiments without departing from the teachings of the example embodiments. Example embodiments of the inventive concepts explained and illustrated herein include their complementary counterparts. Like reference numerals refer to like elements throughout. The same reference numbers indicate the same components throughout the specification.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to limit the example embodiments. As used herein, the singular terms "a," "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein. As used herein, expressions such as "at least one of," when preceding a list of elements, modify the entire list of elements and do not modify the individual elements of the list.

When the terms "about" or "substantially" are used in this specification in connection with a numerical value, it is intended that the associated numerical value include a tolerance of ±10% around the stated numerical value. Moreover, when reference is made to percentages in this specification, it is intended that those percentages are based on weight, i.e., weight percentages. The expression "up to" includes amounts of zero to the expressed upper limit and all values therebetween. When ranges are specified, the range includes all values therebetween such as increments of 0.1%. Moreover, when the words "generally" and "substantially" are used in connection with geometric shapes, it is intended that precision of the geometric shape is not required but that latitude for the shape is within the scope of the disclosure. Although the tubular elements of the embodiments may be cylindrical, other tubular cross-sectional forms are contemplated, such as square, rectangular, oval, triangular and others.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

FIG. 1 is a circuit diagram illustrating a unit memory cell of a magnetic memory device according to example embodiments of the inventive concepts.

Referring to FIG. 1, a unit memory cell UMC may be connected between a first interconnection L1 and a second interconnection L2 that intersect each other. The unit memory cell UMC may include a selection element SW and a magnetic tunnel junction pattern MTJ. The selection element SW and the magnetic tunnel junction pattern MTJ may be electrically connected in series to each other. One of the first and second interconnections L1 and L2 may be used as a word line, and the other of the first and second interconnections L1 and L2 may be used as a bit line.

The selection element SW may selectively control a flow of charges passing through the magnetic tunnel junction pattern MTJ. For example, the selection element SW may be a diode, a PNP bipolar transistor, an NPN bipolar transistor, an NMOS field effect transistor, or a PMOS field effect transistor. If the selection element SW is the bipolar transistor or MOS field effect transistor having three terminals, an additional interconnection (not shown) may be connected to the selection element SW.

The magnetic tunnel junction pattern MTJ may include a first magnetic structure MS1, a second magnetic structure MS2, and a tunnel barrier pattern TBR disposed between the first and second magnetic structures MS1 and MS2. At least one of the first and second magnetic structures MS1 and MS2 may include at least one magnetic layer that is formed of or include a magnetic material. In some example embodiments, the unit memory cell UMC may further include a first conductive structure 130 disposed between the first magnetic structure MS1 and the selection element SW and a second conductive structure 135 disposed between the second magnetic structure MS2 and the second interconnection L2, as illustrated in FIG. 1.

FIGS. 2A, 2B, 2C, 3A, and 3B are schematic views illustrating magnetic tunnel junction patterns, according to example embodiments of the inventive concepts.

Referring to FIGS. 2A, 2B, 2C, 3A, and 3B, a magnetization direction of one of the magnetic layer of the first magnetic structure MS1 and the magnetic layer of the second magnetic structure MS2 may be fixed in a normal use environment regardless of an external magnetic field. Hereinafter, the magnetic layer having the fixed magnetization direction may be defined as a pinned magnetic pattern PL. A magnetization direction of the other of the magnetic layers of the first and second magnetic structures MS1 and MS2 may be switchable by a program magnetic field or program current applied thereto. Hereinafter, the magnetic layer having the switchable or variable magnetization direction may be defined as a free magnetic pattern FL. The magnetic tunnel junction pattern MTJ may include at least one free magnetic pattern FL and at least one pinned magnetic pattern PL that are separated from each other by the tunnel barrier pattern TBR.

An electrical resistance value of the magnetic tunnel junction pattern MTJ may be dependent on the magnetization directions of the free magnetic pattern FL and the pinned magnetic pattern PL. The magnetic tunnel junction pattern MTJ may have a first electrical resistance value when the magnetization directions of the free and pinned magnetic patterns FL and PL are substantially parallel to each other. The magnetic tunnel junction pattern MTJ may have a second electrical resistance value that may be substantially greater or smaller than the first electrical resistance value when the magnetization directions of the free and pinned magnetic patterns FL and PL are substantially anti-parallel to each other. As a result, the electrical resistance value of the magnetic tunnel junction pattern MTJ may be adjusted by changing the magnetization direction of the free magnetic pattern FL. This may be used as a data-storing principle in the magnetic memory device according to example embodiments of the inventive concepts.

The first and second magnetic structures MS1 and MS2 of the magnetic tunnel junction pattern MTJ may be stacked, for example sequentially stacked, on a substrate 100, as illustrated in FIGS. 2A, 2B, 2C, 3A, and 3B. In this case, the magnetic tunnel junction pattern MTJ may be one of various types according to a relative position of the free magnetic pattern FL on the basis of the substrate 100, a formation order of the free and pinned magnetic patterns FL and PL, and/or the magnetization directions of the free and pinned magnetic patterns FL and PL.

Figure 2A:
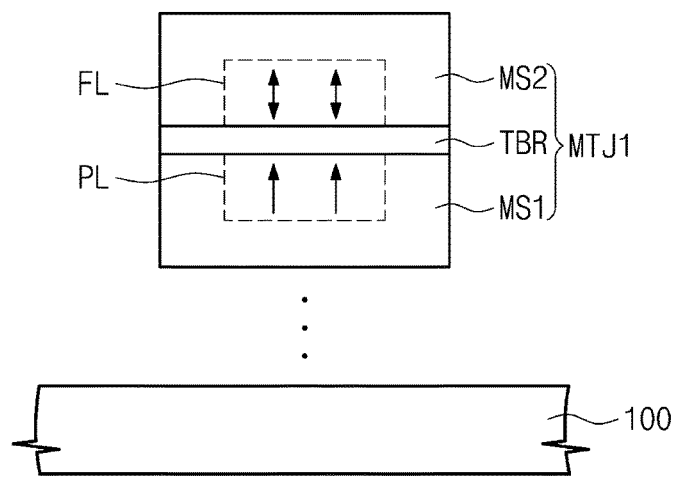
FIGS. 2A, 2B, 2C, 3A, and 3B are schematic views illustrating magnetic tunnel junction patterns, according to example embodiments of the inventive concepts.
Figure 2B:
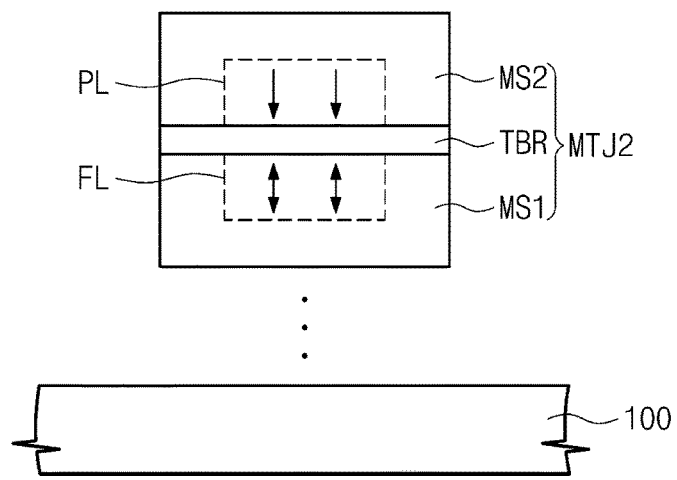

In some example embodiments, the first and second magnetic structures MS1 and MS2 may include magnetic layers having magnetization directions that are substantially perpendicular to a top surface of the substrate 100, respectively. In an example embodiment, as illustrated in FIG. 2A, the magnetic tunnel junction pattern MTJ may be a first type magnetic tunnel junction pattern MTJ1 in which the first magnetic structure MS1 and the second magnetic structure MS2 include the pinned magnetic pattern PL and the free magnetic pattern FL, respectively. In an example embodiment, as illustrated in FIG. 2B, the magnetic tunnel junction pattern MTJ may be a second type magnetic tunnel junction pattern MTJ2 in which the first magnetic structure MS1 and the second magnetic structure MS2 include the free magnetic pattern FL and the pinned magnetic pattern PL, respectively.

Figure 3A:
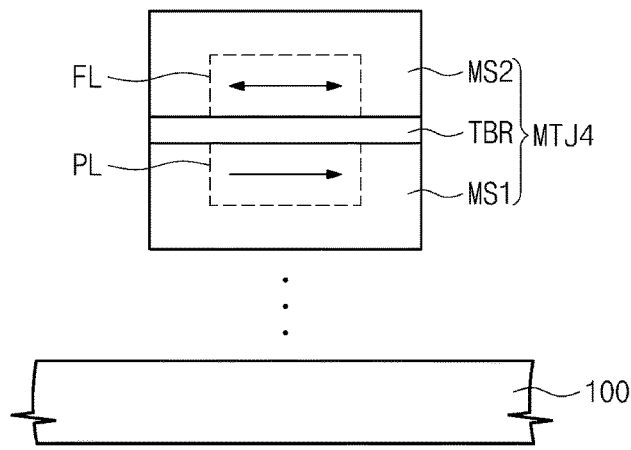
Figure 3B:
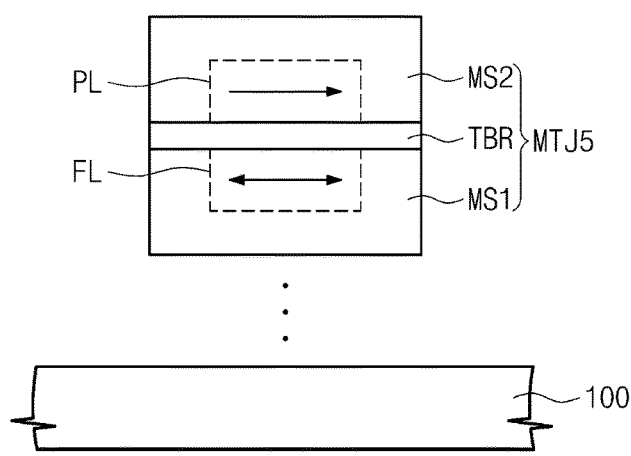

In some example embodiments, the first and second magnetic structures MS1 and MS2 may include magnetic layers having magnetization directions that are substantially parallel to the top surface of the substrate 100, respectively. In an example embodiment, as illustrated in FIG. 3A, the magnetic tunnel junction pattern MTJ may be a fourth type magnetic tunnel junction pattern MTJ4 in which the first magnetic structure MS1 and the second magnetic structure MS2 include the pinned magnetic pattern PL and the free magnetic pattern FL, respectively. In an example embodiment, as illustrated in FIG. 3B, the magnetic tunnel junction pattern MTJ may be a fifth type magnetic tunnel junction pattern MTJ5 in which the first magnetic structure MS1 and the second magnetic structure MS2 include the free magnetic pattern FL and the pinned magnetic pattern PL, respectively.

Figure 2C:
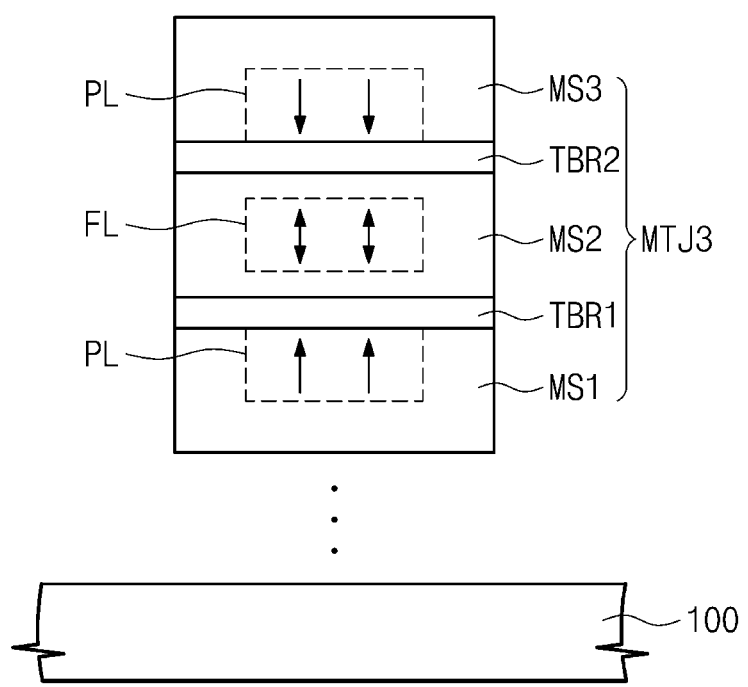

Meanwhile, as illustrated in FIG. 2C, the magnetic tunnel junction pattern MTJ may be a third type magnetic tunnel junction pattern MTJ3 including first, second, and third magnetic structures MS1, MS2, and MS3. The first and second magnetic structures MS1 and MS2 may be separated from each other by a first tunnel barrier pattern TBR1, and the second and third magnetic structures MS2 and MS3 may be separated from each other by a second tunnel barrier pattern TBR2. Here, at least one of the first and third magnetic structures MS1 and MS3 may include at least one pinned magnetic pattern PL, and the second magnetic structure MS2 may include at least one free magnetic pattern FL.

In an example embodiment, magnetization directions of the first and third magnetic structures MS1 and MS3 may be substantially anti-parallel to each other. In other words, the first and third magnetic structures MS1 and MS3 may be in a dual state. However, example embodiments of the inventive concepts are not limited thereto. In an example embodiment, the magnetization directions of the first and third magnetic structures MS1 and MS3 may be substantially parallel to each other. In other words, the first and third magnetic structures MS1 and MS3 may be in a reverse dual state.

Figure 4:
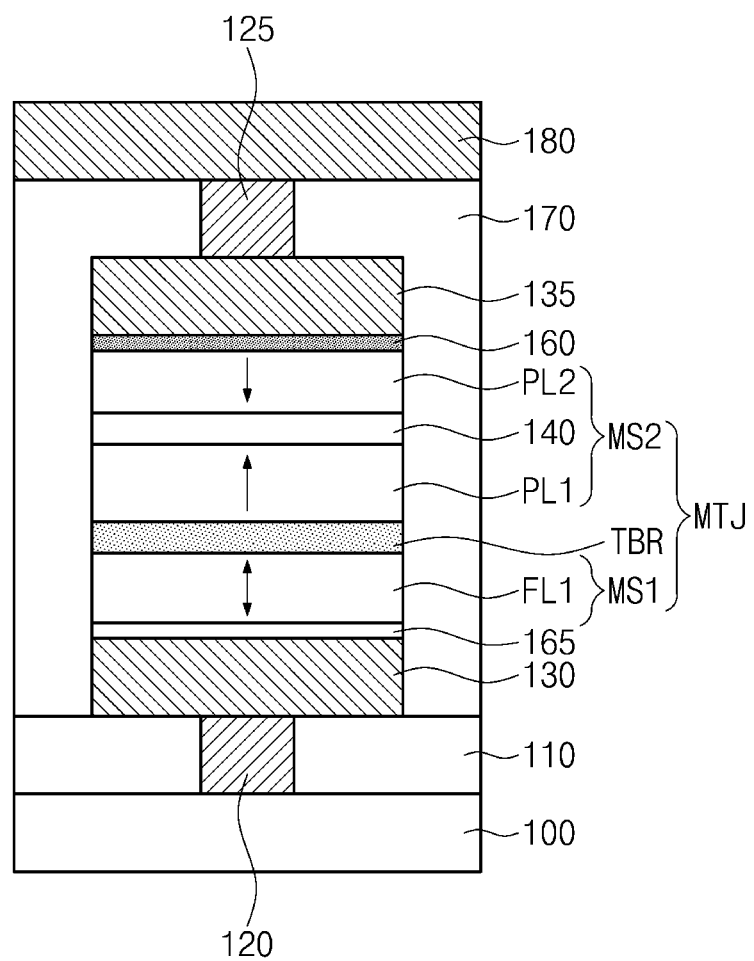
FIG. 4 is a cross-sectional view illustrating a magnetic memory device, according to an example embodiment of the inventive concepts.
Figure 5A:
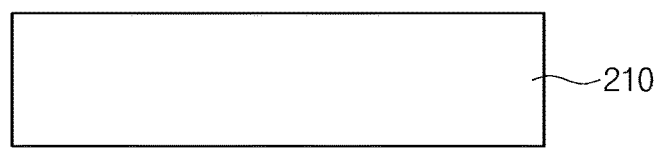
FIGS. 5A and 5B are cross-sectional views illustrating example embodiments of a first pinned magnetic pattern of FIG. 4.
Figure 5B:
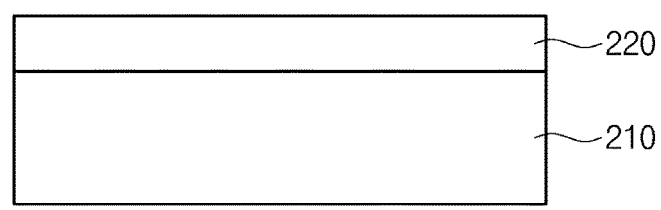

FIG. 4 is a cross-sectional view illustrating a magnetic memory device according to an example embodiment of the inventive concepts. FIGS. 5A and 5B are cross-sectional views illustrating example embodiments of a first pinned magnetic pattern of FIG. 4.

Referring to FIG. 4, a magnetic tunnel junction pattern MTJ corresponding to the second type magnetic tunnel junction pattern MTJ2 of FIG. 2B may be provided. A first dielectric layer 110 may be disposed on a substrate 100, and a lower contact plug 120 may penetrate the first dielectric layer 110. A bottom surface of the lower contact plug 120 may be electrically connected to one terminal of a selection element.

The substrate 100 may include at least one of semiconductor materials, insulating materials, a semiconductor covered with an insulating material, or a conductor covered with an insulating material. In an example embodiment, the substrate 100 may include a silicon wafer.

The first dielectric layer 110 may include at least one of an oxide (e.g., silicon oxide), a nitride (e.g., silicon nitride), or an oxynitride (e.g., silicon oxynitride). The lower contact plug 120 may include a conductive material. For example, the lower contact plug 120 may include at least one of a semiconductor material doped with dopants (e.g., doped silicon, doped germanium, or doped silicon-germanium), a metal (e.g., titanium, tantalum, or tungsten), or a conductive metal nitride (e.g., titanium nitride or tantalum nitride).

A first conductive structure 130, a non-magnetic metal pattern 165, a first magnetic structure MS1, a tunnel barrier pattern TBR, a second magnetic structure MS2, a capping pattern 160, and a second conductive structure 135 may be stacked, for example sequentially stacked, on the first dielectric layer 110. The first conductive structure 130 may be electrically connected to a top surface of the lower contact plug 120. The first magnetic structure MS1, the tunnel barrier pattern TBR, and the second magnetic structure MS2 may constitute the magnetic tunnel junction pattern MTJ. The first conductive structure 130, the magnetic tunnel junction pattern MTJ, and the second conductive structure 135 may have sidewalls aligned with each other. Even though not shown in the drawings, the sidewalls of the first conductive structure 130, the magnetic tunnel junction pattern MTJ, and the second conductive structure 135 may have an inclined profile.

The first magnetic structure MS1 may include a first free magnetic pattern FL1 disposed on the non-magnetic metal pattern 165. The first free magnetic pattern FL1 may be disposed between the non-magnetic metal pattern 165 and the tunnel barrier pattern TBR.

The second magnetic structure MS2 may include a first pinned magnetic pattern PL1 on the tunnel barrier pattern TBR, a second pinned magnetic pattern PL2 on the first pinned magnetic pattern PL1, and an exchange coupling pattern 140 between the first and second pinned magnetic patterns PL1 and PL2. The first pinned magnetic pattern PL1 may be disposed between the tunnel barrier pattern TBR and the exchange coupling pattern 140, and the second pinned magnetic pattern PL2 may be disposed between the exchange coupling pattern 140 and the capping pattern 160.

The first and second pinned magnetic patterns PL1 and PL2 may have magnetization directions that are substantially perpendicular to a top surface of the substrate 100. Likewise, a magnetization direction of the first free magnetic pattern FL1 may also be substantially perpendicular to the top surface of the substrate 100.

The first pinned magnetic pattern PL1 may have a longitudinal axis that is substantially perpendicular to the top surface of the substrate 100. The magnetization direction of the first pinned magnetic pattern PL1 may be fixed in one direction. Likewise, the second pinned magnetic pattern PL2 may also have a longitudinal axis that is substantially perpendicular to the top surface of the substrate 100. The magnetization direction of the second pinned magnetic pattern PL2 may be fixed in a direction that is substantially anti-parallel to the magnetization direction of the first pinned magnetic pattern PL1 by the exchange coupling pattern 140.

By a program operation, the magnetization direction of the first free magnetic pattern FL1 may be changeable to be substantially parallel or substantially anti-parallel to the fixed magnetization direction of the first pinned magnetic pattern PL1. In an example embodiment, the magnetization direction of the first free magnetic pattern FL1 may be changed by a spin torque transfer (STT) program operation. In other words, the magnetization direction of the first free magnetic pattern FL1 may be changed using spin torque of electrons included in a program current.

The first conductive structure 130 may function as an electrode electrically connecting the selection element to the magnetic tunnel junction pattern MTJ. In an example embodiment, the first conductive structure 130 may include a first conductive layer and a second conductive layer that are stacked, for example sequentially stacked. In an example embodiment, the first conductive layer may include tantalum (Ta) or cobalt-hafnium (CoHf), and the second conductive layer may include ruthenium (Ru). The second conductive structure 135 may be in contact with the capping pattern 160 and may function as an electrode electrically connecting the magnetic tunnel junction pattern MTJ to an interconnection 180. The second conductive structure 135 may have a single-layered or multi-layered structure including at least one of a precious metal layer, a magnetic alloy layer, or a metal layer. For example, the precious metal layer may include at least one of ruthenium (Ru), platinum (Pt), palladium (Pd), rhodium (Rh), or iridium (Ir), the magnetic alloy layer may include at least one of cobalt (Co), iron (Fe), or nickel (Ni), and the metal layer may include at least one of tantalum (Ta) or titanium (Ti). However, example embodiments of the inventive concepts are not limited thereto.

The second pinned magnetic pattern PL2 may include a substantially perpendicular magnetic material. In some example embodiments, the second pinned magnetic pattern PL2 may include cobalt-iron-terbium (CoFeTb) having a terbium content of 10% or more, cobalt-iron-gadolinium (CoFeGd) having a gadolinium content of 10% or more, cobalt-iron-dysprosium (CoFeDy), FePt having a $L1_0$ structure, FePd having the $L1_0$ structure, CoPd having the $L1_0$ structure, CoPt having the $L1_0$ structure, a CoPt alloy having a hexagonal close packed (HCP) crystal structure, or an alloy including at least one thereof. In some example embodiments, the second pinned magnetic pattern PL2 may have a stack structure in which magnetic layers and non-magnetic layers are alternately and repeatedly stacked. For example, the stack structure may include at least one of (Co/Pt)n, (CoFe/Pt)n, (CoFe/Pd)n, (Co/Pd)n, (Co/Ni)n, (CoNi/Pt)n, (CoCr/Pt)n, or (CoCr/Pd)n, where "n" denotes the number of bilayers.

The exchange coupling pattern 140 may couple the magnetization direction of the first pinned magnetic pattern PL1 to the magnetization direction of the second pinned magnetic pattern PL2 in such a way that the magnetization direction of the first pinned magnetic pattern PL1 is substantially anti-parallel to the magnetization direction of the second pinned magnetic pattern PL2. In an example embodiment, the exchange coupling pattern 140 may couple the first and second pinned magnetic patterns PL1 and PL2 to each other by Ruderman-Kittel-Kasuya-Yosida (RKKY) interaction. Thus, magnetic fields generated by the magnetization directions of the first and second pinned magnetic patterns PL1 and PL2 may offset each other to reduce or minimize a net magnetic field of the second magnetic structure MS2. As a result, it is possible to reduce or minimize the influence of the magnetic field of the second magnetic structure MS2 on the first free magnetic pattern FL1. The exchange coupling pattern 140 may include at least one of ruthenium (Ru), iridium (Ir), or rhodium (Rh).

Referring to FIG. 5A, according to some example embodiments, the first pinned magnetic pattern PL1 may be a single layer consisting of or including a first layer 210. The first layer 210 may include cobalt-iron-beryllium (CoFeBe). The beryllium (Be) content in the first layer 210 may range from about 2 at % to about 15 at %. The first layer 210 may include $(Co_xFe_{100-x})_{100-z}Be_z$, where "x" is in the range of 1 to 60, and "z" is in the range of 2 to 15. In more detail, "x" may be in a range of 15 to 35, and "z" may be in a range of 5 to 15. When a cobalt content is lower than an iron content in the first layer 210, the first layer 210 may have a relatively high tunneling magnetic resistance (TMR) characteristic. The second pinned magnetic pattern PL2 may not contain beryllium (Be). Accordingly, the beryllium content of the first pinned magnetic pattern PL1 may be higher than that of the second pinned magnetic pattern PL2.

The first layer 210 may be formed directly on the tunnel barrier pattern TBR, and thus, the first layer 210 may have a body-centered cubic (bcc) crystal structure. In some example embodiments, a thickness of the first layer 210 may range from about 7 Å to about 13 Å. In this case, the magnetic tunnel junction pattern MTJ may have an improved tunneling magnetic resistance (TMR) characteristic.

The first layer 210 may further include boron (B). In other word, the first layer 210 may include a cobalt-iron-beryllium-boron (CoFeBeB) alloy. In this case, the beryllium content in the first layer 210 may range from about 2 at % to about 15 at %.

Referring to FIG. 5B, according to some example embodiments, the first pinned magnetic pattern PL1 may have a multi-layered structure including the first layer 210 and a second layer 220 on the first layer 210. The second layer 220 may be a non-magnetic layer. For example, the second layer 220 may include at least one of platinum (Pt), palladium (Pd), or tantalum (Ta). In some example embodiments, the second layer 220 may include a stack structure in which magnetic layers and non-magnetic layers are alternately and repeatedly stacked. For example, the second layer 220 may include at least one of (Co/Pt)n, (CoFe/Pt)n, (CoFe/Pd)n, (Co/Pd)n, (Co/Ni)n, (CoNi/Pt)n, (CoCr/Pt)n, or (CoCr/Pd)n, where "n" denotes the number of bilayers.

A magnetic tunnel junction pattern according to example embodiments of the inventive concepts and a magnetic tunnel junction pattern according to a comparison example were prepared for an experiment. At least one of the magnetic tunnel junction patterns included a free layer (CoFeB), a barrier layer (MgO), and a pinned layer which were sequentially stacked. The pinned layer included a first layer and a second layer which were sequentially stacked. In the magnetic tunnel junction pattern of the comparison example, the first layer included $(Co_{25}Fe_{75})_{80}B_{20}$ and the second layer included Co/Pt and (Co/Pd)n. In the magnetic tunnel junction pattern of the first example embodiment of the inventive concepts, the first layer included $(Co_{25}Fe_{75})_{95}Be_5$ and the second layer included Co/Pt and (Co/Pd)n. In the magnetic tunnel junction pattern of the second example embodiment of the inventive concepts, the first layer included $(Co_{25}Fe_{75})_{90}Be_{10}$ and the second layer included Co/Pt and (Co/Pd)n. In the magnetic tunnel junction pattern of the third example embodiment of the inventive concepts, the first layer included $(Co_{40}Fe_{60})_{90}Be_{10}$ and the second layer included Co/Pt and (Co/Pd)n.

An annealing process (i.e., a thermal treatment process) was performed on the magnetic tunnel junction patterns according to the comparison example and the first to third example embodiments at about 275° C. for about 1 hour. After the annealing process, high-resolution transmission electron microscopy (HR-TEM) and scanning transmission electron microscopy (STEM) image analyses were performed on the magnetic tunnel junction patterns. TMR ratios of the magnetic tunnel junction patterns according to the comparison example and the first to third example embodiments were measured after the annealing process. The results are indicated in Table 1 hereinbelow.

TABLE 1

| Pinned layer | TMR (%) | Crystal structure |
| --- | --- | --- |
| $(Co_{25}Fe_{75})_{80}B_{20}$ | 73% | Amorphous |
| $(Co_{25}Fe_{75})_{95}Be_5$ | 103% | (110) bcc |
| $(Co_{25}Fe_{75})_{90}Be_{10}$ | 69% | (110) bcc |
| $(Co_{40}Fe_{60})_{90}Be_{10}$ | 73% | (110) bcc |

Referring to Table 1, it was verified that the first layer (CoFeB) of the comparison example was not crystallized by the annealing process of 275° C. On the contrary, it was verified that the first layer (CoFeBe) of the first to third example embodiments of the inventive concepts was completely crystallized by the annealing process of 275° C. This may be because the first layer (CoFeBe) of the first to third example embodiments of the inventive concepts was deposited using the tunnel barrier layer (MgO) as a seed to have the bcc crystal structure. As a result, according to example embodiments of the inventive concepts, since the first layer including CoFeBe may be formed on the tunnel barrier layer (MgO), the first layer may have improved crystallizability. Meanwhile, an annealing process may be generally performed at a high temperature of 350° C. to 450° C. to completely crystallize the CoFeB layer of the comparison example.

A TMR ratio of the first layer ($(Co_{25}Fe_{75})_{80}B_{20}$) of the comparison example was about 73%. On the contrary, TMR ratios of the first layer ($(Co_{25}Fe_{75})_{95}Be_5$) of the first example embodiment, the first layer ($(Co_{25}Fe_{75})_{90}Be_{10}$) of the second example embodiment, and the third layer ($(Co_{40}Fe_{60})_{90}Be_{10}$) of the third example embodiment were about 103%, 69% and 73%, respectively. The example embodiments of the inventive concepts may have TMR characteristic at least similar to the comparison example when the beryllium (Be) content in the first layer (CoFeBe) ranges from about 2 at % to about 15 at %. When the cobalt content is lower than the iron content (e.g., $(Co_xFe_{100-x})_{100-z}Be_z$ where "x" is in the range of 15 to 35), the TMR ratio was improved (The TMR ratio of the first example embodiment was about 103%).

In addition, an electron energy loss spectroscopy (EELS) analysis was performed on at least one of the magnetic tunnel junction patterns of the comparison example and the first to third example embodiments after the annealing process.

In the magnetic tunnel junction pattern of the comparison example, metallic atoms or molecules (e.g., Pt) contained in the second layer were diffused to an interface between the tunnel barrier layer (MgO) and the first layer (CoFeB) by the annealing process. In addition, iron atoms or molecules contained in the first layer (CoFeB) were diffused into the tunnel barrier layer (MgO) and the second layer by the annealing process.

Figure 6:
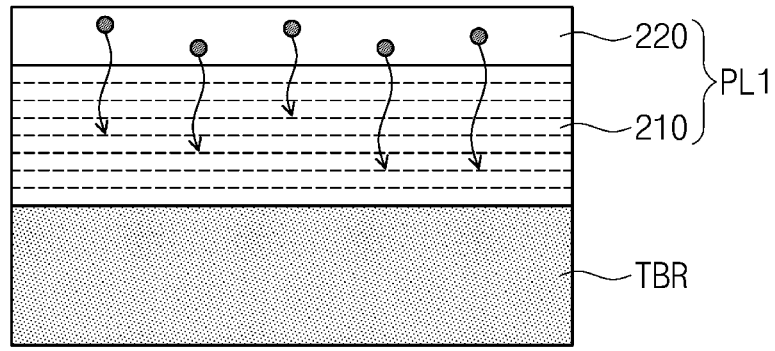
FIG. 6 is a cross-sectional view schematically illustrating the prevention or reduction of diffusion of metallic atoms or molecules disposed in a pinned layer, according to an example embodiment of the inventive concepts.

FIG. 6 is a cross-sectional view schematically illustrating prevention, reduction or inhibition of diffusion of metallic atoms or molecules disposed in a pinned layer in accordance with example embodiments of the inventive concepts. Referring to FIG. 6, in the magnetic tunnel junction pattern of the first to third example embodiments of the inventive concepts, metallic atoms or molecules (e.g., Pt) contained in the second layer 220 were hardly diffused to an interface between the tunnel barrier layer (MgO) TBR and the first layer (CoFeBe) 210 by the annealing process. In addition, iron atoms or molecules contained in the first layer (CoFeBe) 210 were hardly diffused into the tunnel barrier layer (MgO) TBR and the second layer 220 by the annealing process. As described above, the first layer (CoFeBe) 210 according to the example embodiment of the inventive concepts may have the improved crystallizability and improved stability, and thus, the first layer (CoFeBe) 210 may function as a diffusion prevention layer.

Figure 12:
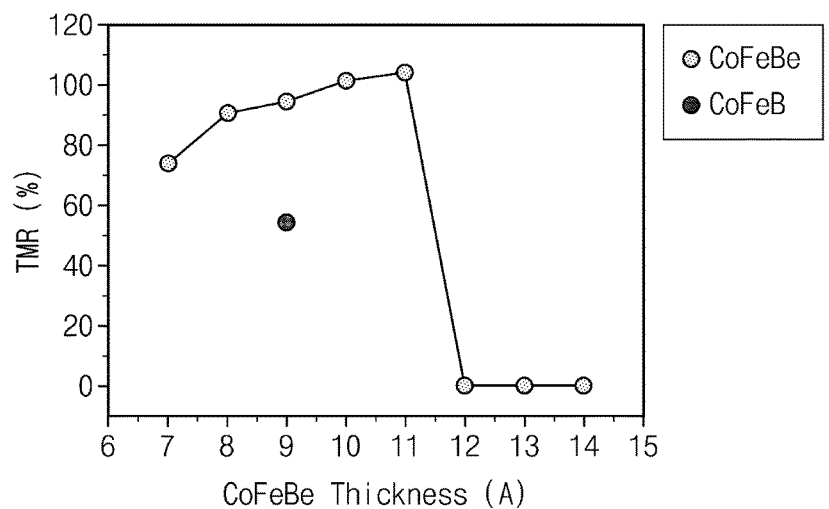
FIG. 12 is a graph illustrating tunneling magnetic resistance (TMR) ratios of magnetic tunnel junction patterns, according to a comparison example and to an example embodiment of the inventive concepts.

TMR ratios of the magnetic tunnel junction patterns according to the comparison example and the first example embodiment were measured after the annealing process, and the measured results were shown in FIG. 12. A thickness of the first layer of the first example embodiment was varied during the measurement.

Referring to FIG. 12, a TMR ratio of the first layer (CoFeB) of the comparison example was smaller than 70% when a thickness of the first layer of the comparison example was about 9 Å. On the contrary, a TMR ratio of the first layer (CoFeBe) of the first example embodiment of the inventive concepts was 70% or more when a thickness of the first layer (CoFeBe) of the example embodiment was in a range of about 7 Å to about 11 Å. In other words, the magnetic tunnel junction pattern according to the example embodiment of the inventive concepts may have improved TMR characteristic as compared with magnetic tunnel junction patterns including other magnetic materials.

Even though not shown in the drawings, in some example embodiments, the second pinned magnetic pattern PL2 and the exchange coupling pattern 140 may be omitted. In other words, one surface of the first pinned magnetic pattern PL1 may be in contact with the tunnel barrier pattern TBR and another surface, opposite to the one surface, of the first pinned magnetic pattern PL1 may be in contact with the capping pattern 160.

The tunnel barrier pattern TBR may be formed of or include a dielectric material. For example, the tunnel barrier pattern TBR may include magnesium oxide (MgO), aluminum oxide (AlO), or a combination thereof.

In an example embodiment, the first free magnetic pattern FL1 may include cobalt-iron-boron (CoFeB). The boron content of the first free magnetic pattern FL1 may range from about 10 at % to about 20 at %. In this case, the first free magnetic pattern FL1 may be crystallized by a thermal treatment process described below, and thus, the magnetic tunnel junction pattern MTJ may have the TMR characteristic. In an example embodiment, the first free magnetic pattern FL1 may be crystallized to have the bcc crystal structure.

In an example embodiment, the free magnetic pattern FL1 may include cobalt-iron-beryllium (CoFeBe). The free magnetic pattern FL1 may not be formed directly on the tunnel barrier pattern TBR, unlike the first pinned magnetic pattern PL1. However, the first free magnetic pattern FL1 may be formed directly on the non-magnetic metal pattern 165, and thus, the first free magnetic pattern FL1 may have the bcc crystal structure, like the first pinned magnetic pattern PL1. In this case, the beryllium content in the first free magnetic pattern FL1 may range from about 2 at % to about 15 at %. The first free magnetic pattern FL1 may be a $(Co_xFe_{100-x})_{100-z}Be_z$ alloy, where "x" may be in the range of 1 to 60 and "z" may be in the range of 2 to 15. In more detail, "x" may be in a range of 40 to 60, and "z" may be in a range of 5 to 15. When a cobalt content is similar to an iron content in the first free magnetic pattern FL1, the first free magnetic pattern FL1 may have relatively high perpendicular magnetic anisotropy even though the first free magnetic pattern FL1 is formed on the non-magnetic metal pattern 165.

A ratio of the cobalt content to the iron content of the first free magnetic pattern FL1 may be different from a ratio of the cobalt content to the iron content of the first layer 210 of the first pinned magnetic pattern PL1. The cobalt content and the iron content may be adjusted to be similar to each other in the first free magnetic pattern FL1, and thus the first free magnetic pattern FL1 may have sufficient perpendicular magnetic anisotropy on the non-magnetic metal pattern 165. Meanwhile, to secure the TMR ratio, the cobalt content may be lower than the iron content in the first layer 210 of the first pinned magnetic pattern PL1. The beryllium content of the first free magnetic pattern FL1 may be substantially equal to or different from the beryllium content of the first layer 210 of the first pinned magnetic pattern PL1. The beryllium content of the first free magnetic pattern FL1 may range from about 2 at % to about 15 at %.

The first free magnetic pattern FL1 may further include boron (B). In other words, the first free magnetic pattern FL1 may include a cobalt-iron-beryllium-boron (CoFeBeB) alloy. Here, the beryllium content in the first free magnetic pattern FL1 may range from about 2 at % to about 15 at %.

The non-magnetic metal pattern 165 may be used as a seed layer for forming the first free magnetic pattern FL1. The non-magnetic metal pattern 165 may include a non-magnetic metal material. The non-magnetic metal material may include at least one of hafnium (Hf), zirconium (Zr), titanium (Ti), tantalum (Ta), tungsten (W), molybdenum (Mo), chromium (Cr), vanadium (V), ruthenium (Ru), or any alloy thereof. In addition, the non-magnetic metal pattern 165 may have a multi-layered structure including at least one of the above mentioned materials. In an example embodiment, the non-magnetic metal pattern 165 may be omitted.

The capping pattern 160 may include a metal oxide. For example, the capping pattern 160 may include at least one of tantalum oxide, magnesium oxide, titanium oxide, zirconium oxide, hafnium oxide, or zinc oxide. The capping pattern 160 may assist the second magnetic structure MS2 to have the magnetization direction that is substantially perpendicular to the top surface of the substrate 100. A resistance value of the capping pattern 160 may be equal to or less than about a third of a resistance value of the tunnel barrier pattern TBR.

A second dielectric layer 170 may be formed on an entire surface of the substrate 100 to cover the first conductive structure 130, the magnetic tunnel junction pattern MTJ, and the second conductive structure 135. An upper contact plug 125 may penetrate the second dielectric layer 170 so as to be connected to the second conductive structure 135. The second dielectric layer 170 may include at least one of an oxide (e.g., silicon oxide), a nitride (e.g., silicon nitride), or an oxynitride (e.g., silicon oxynitride). The upper contact plugs 125 may include at least one of a metal (e.g., titanium, tantalum, copper, aluminum, or tungsten) or a conductive metal nitride (e.g., titanium nitride or tantalum nitride).

The interconnection 180 may be disposed on the second dielectric layer 170. The interconnection 180 may be connected to the upper contact plug 125. The interconnection 180 may include at least one of a metal (e.g., titanium, tantalum, copper, aluminum, or tungsten) or a conductive metal nitride (e.g., titanium nitride or tantalum nitride). In some example embodiments, the interconnection 180 may be a bit line.

Magnetic tunnel junction patterns according to example embodiments of the inventive concepts and a magnetic tunnel junction pattern according to a second comparison example were prepared for an experiment. At least one of the magnetic tunnel junction patterns included a free layer, a tunnel barrier layer (MgO), and a pinned layer (CoFeB) which were sequentially stacked. In the magnetic tunnel junction pattern of the second comparison example, the free layer included $(Co_{25}Fe_{75})_{80}B_{20}$. In the magnetic tunnel junction pattern of a fourth example embodiment, the free layer included $(Co_{40}Fe_{60})_{95}Be_5$. In the magnetic tunnel junction pattern of a fifth example embodiment, the free layer included $(Co_{40}Fe_{60})_{90}Be_{10}$. In the magnetic tunnel junction pattern of a sixth example embodiment, the free layer included $(Co_{40}Fe_{60})_{85}Be_{15}$. In the magnetic tunnel junction pattern of a seventh example embodiment, the free layer included $(Co_{40}Fe_{60})_{80}Be_{20}$.

An annealing process was performed on each of the magnetic tunnel junction patterns according to the second comparison example and the fourth to seventh example embodiments at 275° C. for 1 hour. Anisotropic magnetic field (Hk) values of the magnetic tunnel junction patterns were measured. The anisotropic magnetic field (Hk) may express the perpendicular magnetic anisotropy. The results are shown in FIG. 13.

Figure 13:
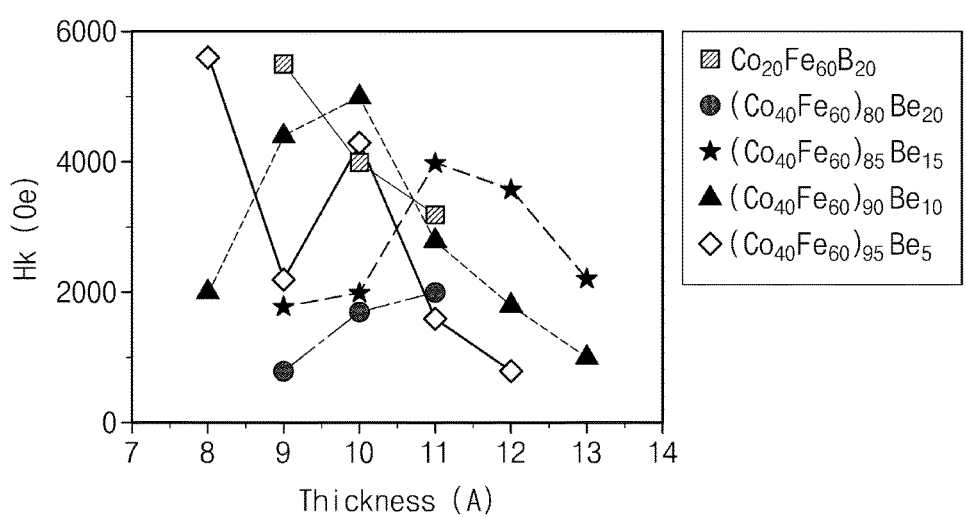
FIG. 13 is a graph illustrating anisotropic magnetic fields (Hk) of magnetic tunnel junction patterns, according to a comparison example and to an example embodiment of the inventive concepts.

Referring to FIG. 13, the anisotropic magnetic field (Hk) values of the fourth example embodiment ($(Co_{40}Fe_{60})_{95}Be_5$), the fifth example embodiment ($(Co_{40}Fe_{60})_{90}Be_{10}$), and the sixth example embodiment ($(Co_{40}Fe_{60})_{85}Be_{15}$) are similar to the anisotropic magnetic field (Hk) value of the second comparison example ($(Co_{25}Fe_{75})_{80}B_{20}$). In other words, it may be recognized that the perpendicular magnetic anisotropy is improved in the range in which the cobalt content is similar to the iron content (e.g., $(Co_xFe_{100-x})_{100-z}Be_z$ where "x" ranges from 40 to 60).

In addition, magnetic tunnel junction patterns using a $(Co_{25}Fe_{25})_{95}Be_5$ layer, a $(Co_{40}Fe_{60})_{95}Be_5$ layer, a $(Co_{40}Fe_{60})_{90}Be_{10}$ layer, a $(Co_{40}Fe_{60})_{85}Be_{15}$ layer, and a $(Co_{40}Fe_{60})_{80}Be_{20}$ layer as magnetic layers (free layers or pinned layers) were prepared. A magnetic tunnel junction pattern using a $(Co_{25}Fe_{75})_{80}B_{20}$ layer as a magnetic layer (a free layer or a pinned layer) was prepared as a point of reference (POR). Saturation magnetizations (M), anisotropic magnetic fields (Hk), and TMRs of the magnetic tunnel junction patterns were measured, and the results are indicated in Table 2 hereinbelow. Values in Table 2 are comparison values relative to a reference value.

TABLE 2

| | | | TMR/TMR$_{POR}$ | |
|---|---|---|---|---|
| | M/M$_{POR}$ | Hk/Hk$_{POR}$ | Free layer | Pinned layer |
| $(Co_{25}Fe_{75})_{80}B_{20}$ (POR) | 1 | 1 | 1 | 1 |
| $(Co_{25}Fe_{25})_{95}Be_5$ | 0.86 | 0.5 | 1 | 1.8 |
| $(Co_{40}Fe_{60})_{95}Be_5$ | 0.8 | 0.8 | 1 | — |
| $(Co_{40}Fe_{60})_{90}Be_{10}$ | 0.7 | 0.96 | 1.4 | 1.4 |
| $(Co_{40}Fe_{60})_{85}Be_{15}$ | 0.62 | 0.72 | 0.5 | 1.1 |
| $(CO_{40}Fe_{60})_{80}Be_{20}$ | 0.57 | 0.25 | 0.4 | 1 |

Referring to Table 2, as described with reference to Table 1 and the first example embodiment, the $(Co_{25}Fe_{25})_{95}Be_5$ layer may have an improved TMR ratio. On the contrary, the $(Co_{25}Fe_{25})_{95}Be_5$ layer may have a relatively low anisotropic magnetic field (Hk). The $(Co_{40}Fe_{60})_{90}Be_{10}$ layer may have an improved TMR ratio and may have an anisotropic magnetic field (Hk) similar to that of the $(Co_{25}Fe_{75})_{80}B_{20}$ layer. In other words, the $(Co_xFe_{100-x})_{100-z}Be_z$ layer may have a relatively high TMR characteristic when "x" is in a range of 15 to 35, and the $(Co_xFe_{100-x})_{100-z}Be_z$ layer may have relatively high perpendicular magnetic anisotropy when "x" is in a range of 40 to 60.

Figure 7A:
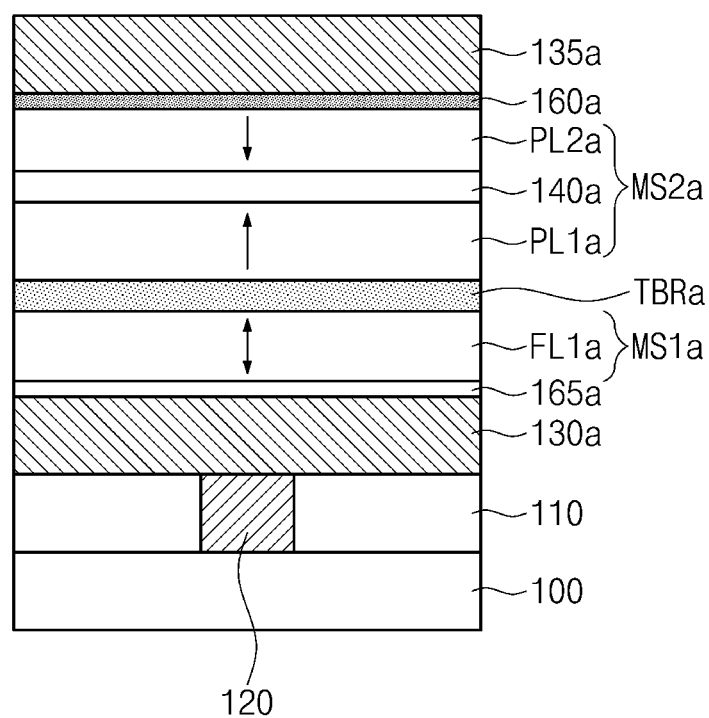
FIGS. 7A and 7B are cross-sectional views illustrating a method for manufacturing a magnetic memory device, according to an example embodiment of the inventive concepts.
Figure 7B:
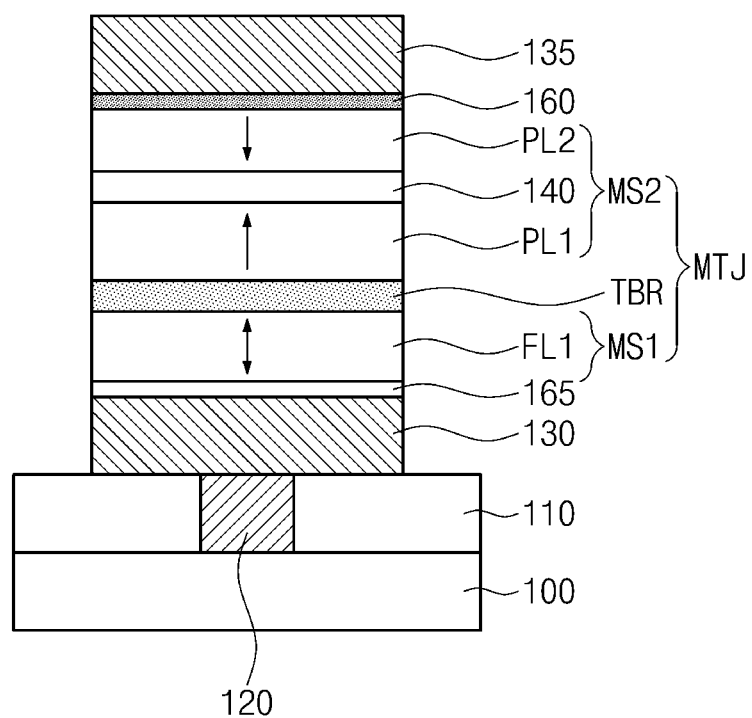

FIGS. 7A and 7B are cross-sectional views illustrating a method for manufacturing a magnetic memory device, according to an example embodiment of the inventive concepts.

Referring to FIG. 7A, a first dielectric layer 110 may be formed on a substrate 100. A lower contact plug 120 may be formed to penetrate the first dielectric layer 110. A first preliminary conductive structure 130a may be formed on the first dielectric layer 110. The first preliminary conductive structure 130a may be electrically connected to a top surface of the lower contact plug 120.

A non-magnetic metal layer 165a may be formed on the first preliminary conductive structure 130a. In an example embodiment, the non-magnetic metal layer 165a may be deposited by a sputtering process corresponding to a kind of a physical vapor deposition (PVD) process.

A first preliminary magnetic structure MS1a may be formed on the non-magnetic metal layer 165a. The first preliminary magnetic structure MS1a may include a first free magnetic layer FL1a. In an example embodiment, the first free magnetic layer FL1a may be deposited using the non-magnetic metal layer 165a as a seed layer. In an example embodiment, the first free magnetic layer FL1a may have the same crystal structure as the non-magnetic metal layer 165a. For example, the free magnetic layer FL1a may include the same material as the first free magnetic pattern FL1 described with reference to FIG. 4. In an example embodiment, the first free magnetic FL1a may be deposited by a sputtering process.

A tunnel barrier layer TBRa may be formed on the first free magnetic layer FL1a. In an example embodiment, the tunnel barrier layer TBRa may be formed by a sputtering process using a tunnel barrier material as a target. The target may include a tunnel barrier material of which stoichiometry is accurately controlled. The tunnel barrier layer TBRa may include at least one of magnesium oxide (MgO) or aluminum oxide (AlO). For example, the tunnel barrier layer TBRa may be formed of or include magnesium oxide (MgO) having a sodium chloride crystal structure.

A second preliminary magnetic structure MS2a may be formed on the tunnel barrier layer TBRa. The second preliminary magnetic structure MS2a may include a first pinned magnetic layer PL1a, an exchange coupling layer 140a, and a second pinned magnetic layer PL2a.

The first pinned magnetic layer PL1a may be deposited on the tunnel barrier layer TBRa. The first pinned magnetic PL1a may be formed using the tunnel barrier layer TBRa as a seed. Thus, the first pinned magnetic PL1a may have the same crystal structure (e.g., the bcc crystal structure) as the tunnel barrier layer TBRa. As described with reference to the example embodiment of the inventive concepts discussed above, the first pinned magnetic layer PL1a including the CoFeBe layer may be formed directly on the tunnel barrier layer TBRa, and thus, the first pinned magnetic PL1a may have high crystallizability. For example, the first pinned magnetic layer PL1a may include the same material as the first pinned magnetic pattern PL1 described with reference to FIGS. 4, 5A, and 5B. In an example embodiment, the first pinned magnetic layer PL1a may be formed by a sputtering process. The sputtering process for forming the first pinned magnetic layer PL1a may use a target including CoFeBe, and the beryllium content in the target may range from about 2 at % to about 15 at %.

The exchange coupling layer 140a may be deposited on the first pinned magnetic layer PL1a. In an example embodiment, the exchange coupling layer 140a may be formed using the first pinned magnetic layer PL1a as a seed. For example, the exchange coupling layer 140a may be formed of or include ruthenium having an HCP crystal structure. In an example embodiment, the exchange coupling layer 140a may be deposited by a sputtering process.

The second pinned magnetic layer PL2a may be deposited on the exchange coupling layer 140a. The second pinned magnetic layer PL2a may be deposited by a sputtering process. When the second pinned magnetic layer PL2a is formed of or include an CoPt alloy, the second pinned magnetic layer PL2a may be formed by a sputtering process using an argon (Ar) gas. In this case, the second pinned magnetic layer PL2a may be formed of or include a CoPt alloy doped with boron to reduce saturation magnetization of the second pinned magnetic layer PL2a.

A thermal treatment process may be performed after the formation of the second preliminary magnetic structure MS2a. The first and second preliminary magnetic structures MS1a and MS2a may be completely crystallized by the thermal treatment process. The thermal treatment process may be performed at a temperature of about 200° C. to about 400° C. In particular, the thermal treatment process may be performed at a temperature of about 200° C. to about 300° C. Since the first free magnetic layer FL1a and/or the first pinned magnetic layer PL1a include CoFeBe, a high TMR characteristic may be realized even though the thermal treatment process is performed at a relatively low temperature.

A capping layer 160a and a second preliminary conductive structure 135a may be sequentially formed on the second pinned magnetic layer PL2a. In an example embodiment, the thermal treatment process may be performed after the formation of the second preliminary conductive structure 135a. In an example embodiment, the thermal treatment process may be performed after the formation of the second pinned magnetic layer PL2a and before the formation of the capping layer 160a. In an example embodiment, the thermal treatment process may be performed after the formation of the capping layer 160a and before the formation of the second preliminary conductive structure 135a.

The capping layer 160a may be formed of or include at least one of tantalum oxide, magnesium oxide, titanium oxide, zirconium oxide, hafnium oxide, or zinc oxide. The second preliminary conductive structure 135a may be formed to have a single-layered or multi-layered structure including at least one of a precious metal layer, a magnetic alloy layer, or a metal layer. The second preliminary conductive structure 135a may include the same material as the second conductive structure 135 described with reference to FIG. 4.

Referring to FIG. 7B, the second preliminary conductive structure 135a, the capping layer 160a, the second pinned magnetic layer PL2a, the exchange coupling layer 140a, the first pinned magnetic layer PL1a, the tunnel barrier layer TBRa, the first free magnetic layer FL1, the non-magnetic metal layer 165a, and the first preliminary conductive structure 130a may be patterned, for example sequentially patterned to form a first conductive structure 130, a non-magnetic metal pattern 165, a first free magnetic pattern FL1, a tunnel barrier pattern TBR, a first pinned magnetic pattern PL1, an exchange coupling pattern 140, a second pinned magnetic pattern PL2, a capping pattern 160, and a second conductive structure 135 which are sequentially stacked.

Referring again to FIG. 4, the second dielectric layer 170 may be formed to cover the first conductive structure 130, the magnetic tunnel junction pattern MTJ, and the second conductive structure 135. The upper contact plug 125 may be formed to penetrate the second dielectric layer 170. The upper contact plug 125 may be connected to the second conductive structure 135. The interconnection 180 may be formed on the second dielectric layer 170. The interconnection 180 may be connected to the upper contact plug 125.

Figure 8:
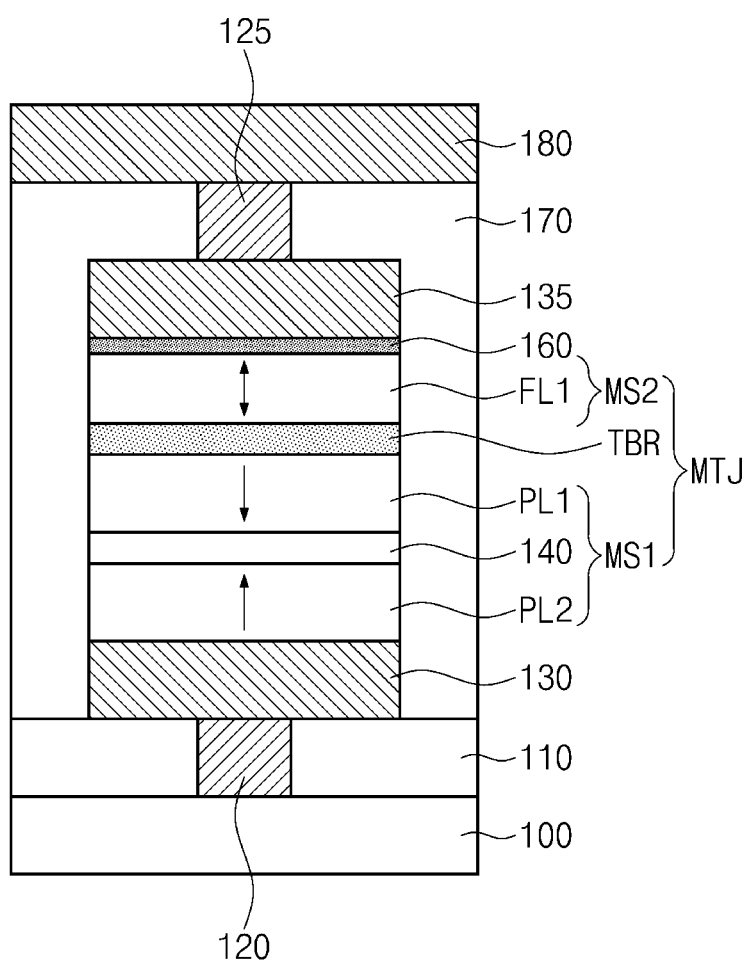
FIG. 8 is a cross-sectional view illustrating a magnetic memory device, according to an example embodiment of the inventive concepts.

FIG. 8 is a cross-sectional view illustrating a magnetic memory device according to an example embodiment of the inventive concepts. In the example embodiment, the same elements as described in the embodiment of FIG. 4 will be indicated by the same reference numerals or the same reference designators, and the descriptions to the same elements as in the example embodiment of FIG. 4 will be omitted or mentioned briefly for the purpose of ease and convenience in explanation. In other words, mostly differences between the various example embodiments will be described hereinafter.

Referring to FIG. 8, a magnetic tunnel junction pattern MTJ according to the example embodiment may correspond to the first type magnetic tunnel junction pattern MTJ1 illustrated in FIG. 2A. In detail, a first magnetic structure MS1 may include a second pinned magnetic pattern PL2 on the first conductive structure 130, a first pinned magnetic pattern PL1 on the second pinned magnetic pattern PL2, and an exchange coupling pattern 140 between the first and second pinned magnetic patterns PL1 and PL2. A second magnetic structure MS2 may include the first free magnetic pattern FL1 disposed on the tunnel barrier pattern TBR.

In other words, the first free magnetic pattern FL1 may be disposed between the tunnel barrier pattern TBR and the capping pattern 160, unlike the magnetic memory device described with reference to FIG. 4. The first and second pinned magnetic patterns PL1 and PL2 may be disposed between the first conductive structure 130 and the tunnel barrier pattern TBR.

For example, the first pinned magnetic pattern PL1 may have a single-layered or multi-layered structure including at least one of CoFeB, CoFeBe, FeB, CoFeBTa, CoHf, Co, or CoZr. In some example embodiments, the first pinned magnetic pattern PL1 may include $(Co_xFe_{100-x})_{100-z}Be_z$ (where "x" may be in a range of 1 to 60 and "z" may be in a range of 2 to 15), like the first pinned magnetic pattern PL1 described with reference to FIG. 4.

The first free magnetic pattern FL1 may include the $(Co_xFe_{100-x})_{100-z}Be_z$ alloy (where "x" may be in a range of 1 to 60 and "z" may be in a range of 2 to 15), like the first free magnetic pattern FL1 described with reference to FIG. 4.

A magnetic tunnel junction pattern including a $(Co_{25}Fe_{75})_{95}Be_5$ free layer disposed on a tunnel barrier layer (MgO) was prepared in an eighth example embodiment of the inventive concepts. A magnetic tunnel junction pattern including a $(Co_{40}Fe_{60})_{80}Be_{20}$ free layer disposed on a tunnel barrier layer (MgO) was prepared in a ninth example embodiment of the inventive concepts. TMR ratios of these magnetic tunnel junction patterns were measured, and the measured results were shown in FIG. 14.

Figure 14:
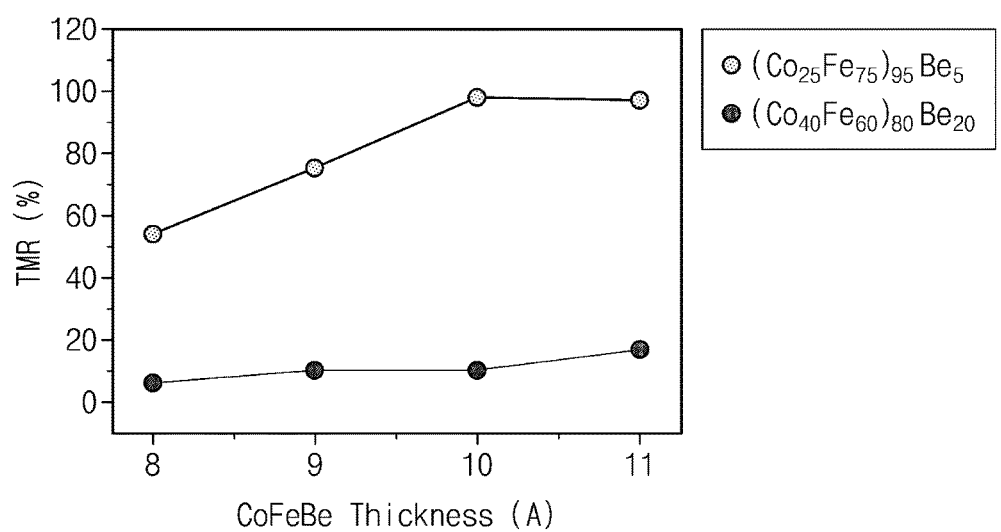
FIG. 14 is a graph illustrating TMR ratios of a free layer containing cobalt-iron-beryllium (CoFeBe), according to an example embodiment of the inventive concepts.

Referring to FIG. 14, when the $(Co_{25}Fe_{75})_{95}Be_5$ layer of the eighth example embodiment was used as the free layer on the tunnel barrier layer, the TMR ratios of the magnetic tunnel junction patterns were equal to or greater than about 60% in a CoFeBe thickness range of about 8 Å to about 11 Å. In addition, perpendicular magnetic anisotropy characteristics of the magnetic tunnel junction patterns were also high. Thus, characteristics of the magnetic tunnel junction pattern may be improved in the case in which the $(Co_{25}Fe_{75})_{95}Be_5$ layer according to example embodiments of the inventive concepts is used as the free layer on the tunnel barrier layer as well as the case in which the CoFeBe layer according to example embodiments of the inventive concepts is used as the pinned layer on the tunnel barrier layer (MgO) as described with reference to FIG. 4. On the contrary, when the $(Co_{40}Fe_{60})_{80}Be_{20}$ layer of the ninth example embodiment was used as the free layer, the TMR ratios of the magnetic tunnel junction patterns were lower than about 20% in a CoFeBe thickness range of about 8 Å to about 11 Å. In other words, the magnetic tunnel junction pattern according to example embodiments of the inventive concepts may have improved TMR characteristic when the beryllium content of the CoFeBe layer may be in a range of about 2 at % to about 15 at %. However, if the beryllium content of the CoFeBe layer is greater than about 15 at %, the TMR characteristic of the magnetic tunnel junction pattern may be deteriorated. This may be because the CoFeBe layer may not maintain the crystallizability when the beryllium content of the CoFeBe layer is greater than 15 at %.

Figure 9:
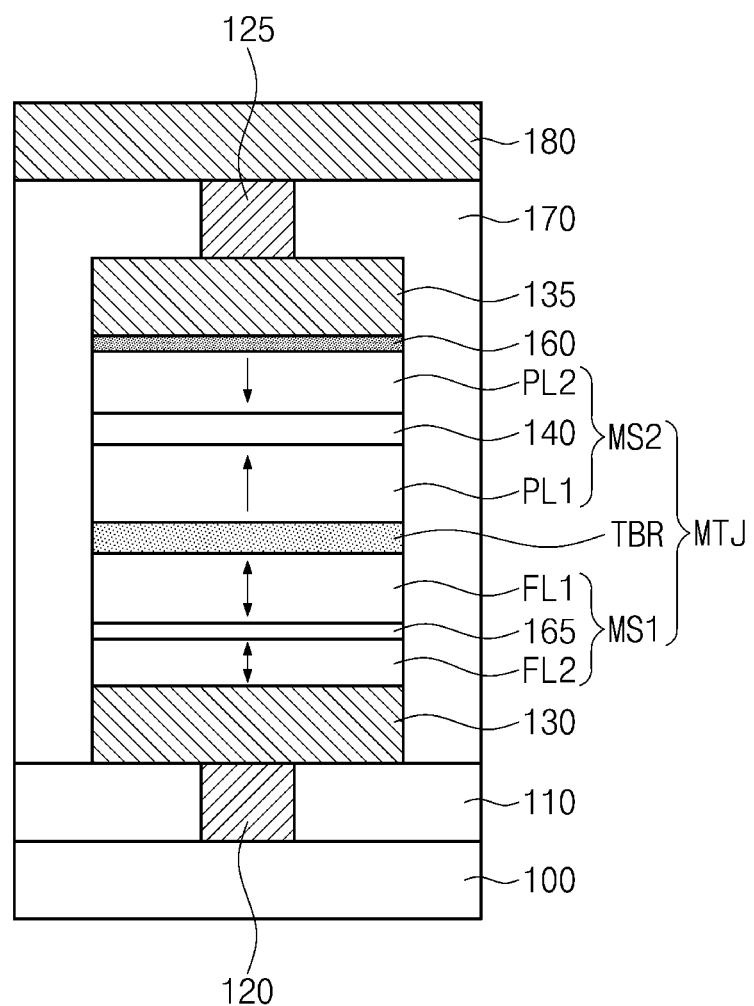
FIG. 9 is a cross-sectional view illustrating a magnetic memory device, according to an example embodiment of the inventive concepts.

FIG. 9 is a cross-sectional view illustrating a magnetic memory device according to an example embodiment of the inventive concepts. In the example embodiment, the same elements as described in the embodiment of FIG. 4 will be indicated by the same reference numerals or the same reference designators, and the descriptions to the same elements as in the example embodiment of FIG. 4 will be omitted or mentioned briefly. In other words, mainly differences between the various example embodiments will be mainly described hereinafter.

Referring to FIG. 9, a first magnetic structure MS1 may include a second free magnetic pattern FL2 on the first conductive structure 130, a first free magnetic pattern FL1 on the second free magnetic pattern FL2, and a non-magnetic metal pattern 165 between the first and second free magnetic patterns FL1 and FL2.

The non-magnetic metal pattern 165 may include a non-magnetic metal material. The non-magnetic metal material may include at least one of hafnium (Hf), zirconium (Zr), titanium (Ti), tantalum (Ta), tungsten (W), molybdenum (Mo), chromium (Cr), vanadium (V), ruthenium (Ru), or any alloy thereof.

The second free magnetic pattern FL2 may be coupled to the first free magnetic pattern FL1 by the non-magnetic metal pattern 165, and thus, the second free magnetic pattern FL2 may have a substantially perpendicular magnetization direction with respect to the substrate 100, the magnetization direction being substantially parallel to a magnetization direction of the first free magnetic pattern FL1. The non-magnetic metal pattern 165 may have a thickness of about 10 Å or less. In an example embodiment, the non-magnetic metal pattern 165 may be omitted.

In some example embodiments, the second free magnetic pattern FL2 may include at least one of iron (Fe), cobalt (Co), nickel (Ni), or any alloy thereof. In some example embodiments, the second free magnetic pattern FL2 may further include a non-magnetic material. The non-magnetic material of the second free magnetic pattern FL2 may include at least one of Ta, Ti, Zr, Hf, B, W, Mo, or Cr. For example, the second free magnetic pattern FL2 may include iron (Fe) including the non-magnetic material (e.g., boron), or cobalt (Co) including the non-magnetic material (e.g., boron).

Figure 10:
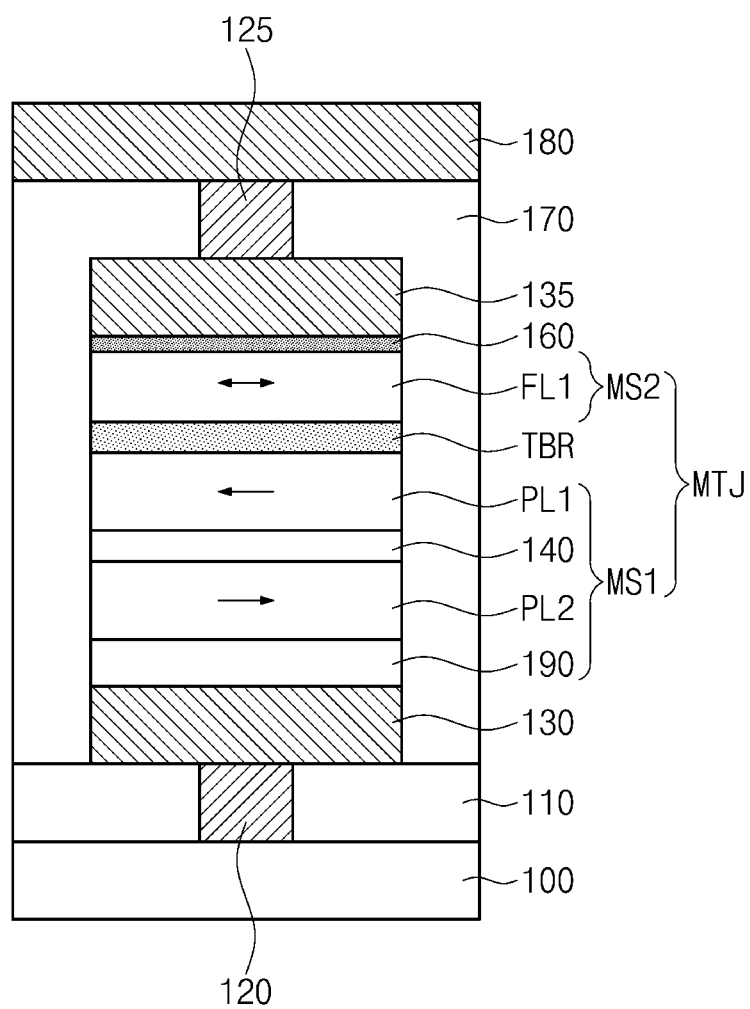
FIG. 10 is a cross-sectional view illustrating a magnetic memory device, according to an example embodiment of the inventive concepts.

FIG. 10 is a cross-sectional view illustrating a magnetic memory device according to an example embodiment of the inventive concepts. In the example embodiment, the same elements as described in the embodiment of FIG. 8 will be indicated by the same reference numerals or the same reference designators, and the descriptions to the same elements as in the embodiment of FIG. 8 will be omitted or mentioned briefly. In other words, mainly differences between the various example embodiments will be described hereinafter.

Referring to FIG. 10, a magnetic tunnel junction pattern MTJ according to the example embodiment may correspond to the fourth type magnetic tunnel junction pattern MTJ4 illustrated in FIG. 3A. In other words, unlike the magnetic memory devices described above, the magnetic tunnel junction pattern MTJ according to the example embodiment may include magnetic layers having magnetization directions that are substantially parallel to the top surface of the substrate 100.

A first magnetic structure MS1 may include a pinning pattern 190, a first pinned magnetic pattern PL1, an exchange coupling pattern 140, and a second pinned magnetic pattern PL2 which are sequentially stacked on a first conductive structure 130. The second pinned magnetic pattern PL2 may be disposed between the pinning pattern 190 and the exchange coupling pattern 140, and the first pinned magnetic pattern PL1 may be disposed between the exchange coupling pattern 140 and a tunnel barrier pattern TBR. In other words, the first magnetic structure MS1 according to the example embodiment may be a multi-layered magnetic structure including the first and second pinned magnetic patterns PL1 and PL2 having magnetization directions that are substantially parallel to the top surface of the substrate 100.

The magnetization direction of the second pinned magnetic pattern PL2 may be fixed by the pinning pattern 190.

The exchange coupling pattern 140 may couple the magnetization direction of the second pinned magnetic pattern PL2 to the magnetization direction of the first pinned magnetic pattern PL1 in such a way that the magnetization directions of the first and second pinned magnetic patterns PL1 and PL2 are substantially anti-parallel to each other.

The pinning pattern 190 may include an anti-ferromagnetic material. For example, the pinning pattern 190 may include at least one of platinum-manganese (PtMn), iridium-manganese (IrMn), manganese oxide (MnO), manganese sulfide (MnS), manganese-tellurium (MnTe), or manganese fluoride (MnF).

The second pinned magnetic pattern PL2 may include a ferromagnetic material. For example, the second pinned magnetic pattern PL2 may include at least one of CoFeB, CoFe, NiFe, CoFePt, CoFePd, CoFeCr, CoFeTb, or CoFeNi. The exchange coupling pattern 140 may include at least one of ruthenium (Ru), iridium (Ir), or rhodium (Rh).

The first pinned magnetic pattern PL1 may include a ferromagnetic material. For example, the first pinned magnetic pattern PL1 may include at least one of CoFeB, CoFeBe, CoFe, NiFe, CoFePt, CoFePd, CoFeCr, CoFeTb, or CoFeNi.

A second magnetic structure MS2 may include a first free magnetic pattern FL1 disposed on the tunnel barrier pattern TBR. The second magnetic structure MS2 may include at least one free magnetic pattern FL1 having a magnetization direction that is substantially parallel to the top surface of the substrate 100.

The first free magnetic pattern FL1 may include the $(Co_xFe_{100-x})_{100-z}Be_z$ alloy, like the first free magnetic pattern FL1 described with reference to FIG. 4. At this time, "x" may be in a range of 1 to 60 and "z" may be in a range of 2 to 15.

Meanwhile, even though not shown in the drawings, the fifth type magnetic tunnel junction pattern MTJ5 may be formed on the substrate 100 in some example embodiments. In this case, the first free magnetic pattern FL1 of FIG. 10 may be disposed under the tunnel barrier pattern TBR and the first and second pinned magnetic patterns PL1 and PL2 of FIG. 10 may be disposed on the tunnel barrier pattern TBR.

Figure 11:
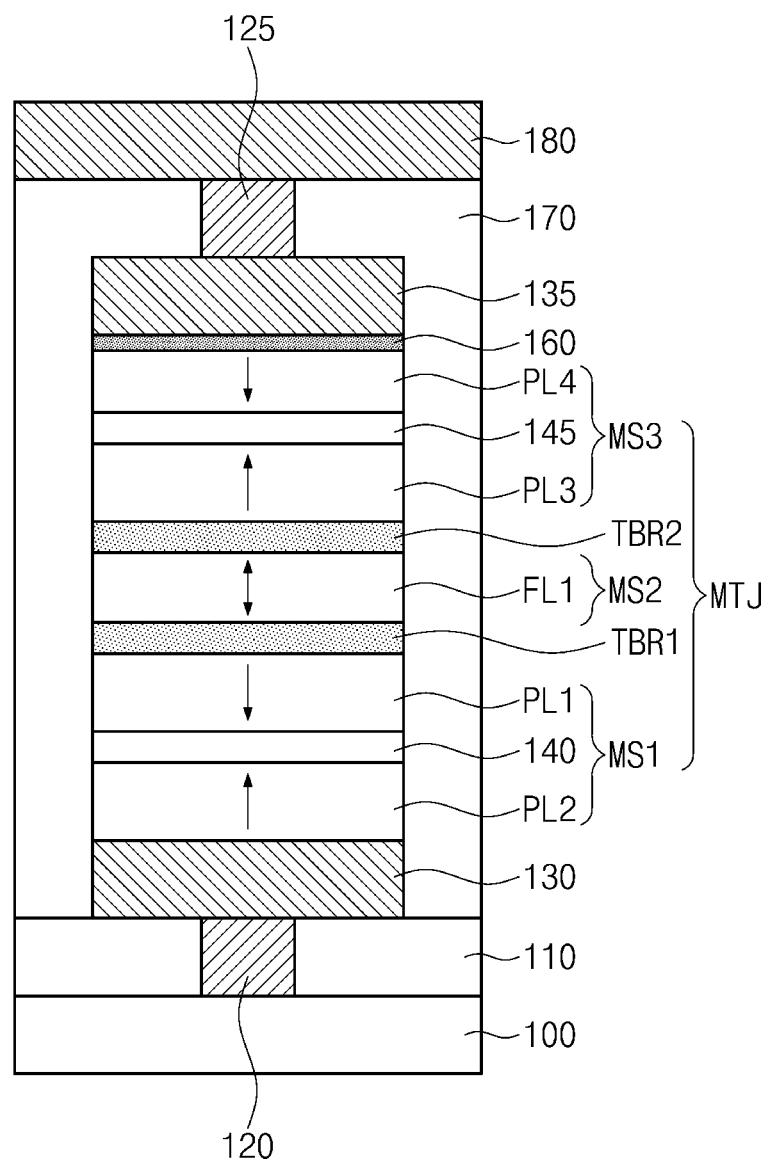
FIG. 11 is a cross-sectional view illustrating a magnetic memory device, according to an example embodiment of the inventive concepts.

FIG. 11 is a cross-sectional view illustrating a magnetic memory device according to an example embodiment of the inventive concepts. In the example embodiment, the same elements as described in the embodiment of FIG. 8 will be indicated by the same reference numerals or the same reference designators, and the descriptions to the same elements as in the embodiment of FIG. 8 will be omitted or mentioned briefly. In other words, mainly differences between the various embodiments will be described hereinafter.

Referring to FIG. 11, a magnetic tunnel junction pattern MTJ corresponding to the third type magnetic tunnel junction pattern MTJ3 of FIG. 2C may be provided on the substrate 100. In other words, unlike the magnetic tunnel junctions described above, the magnetic tunnel junction pattern MTJ according to the example embodiment may be a double magnetic tunnel junction pattern. In detail, the magnetic tunnel junction pattern MTJ may include a first magnetic structure MS1, a second magnetic structure MS2, a third magnetic structure MS3, a first tunnel barrier pattern TBR1 between the first and second magnetic structures MS1 and MS2, and a second tunnel barrier pattern TBR2 between the second and third magnetic structures MS2 and MS3. Here, the first magnetic structure MS1, the first tunnel barrier pattern TBR1, and the second magnetic structure MS2 may be the same as the first magnetic structure MS1, the tunnel barrier pattern TBR, and the second magnetic structure MS2 described with reference to FIG. 8.

The third magnetic structure MS3 may include a third pinned magnetic pattern PL3 on the second tunnel barrier pattern TBR2, a fourth pinned magnetic pattern PL4 on the third pinned magnetic pattern PL3, and a second exchange coupling pattern 145 between the third and fourth pinned magnetic patterns PL3 and PL4. The third magnetic structure MS3 may be the same as the second magnetic structure MS2 described with reference to FIG. 4. For example, the third pinned magnetic pattern PL3 may include cobalt-iron-beryllium (CoFeBe).

The magnetic memory device may include the magnetic pattern that contains CoFeBe and is disposed on the tunnel barrier pattern. Even though a low-temperature thermal treatment process is performed, the magnetic pattern may have an improved crystallization property, a high TMR ratio, and a low switching current.

While the inventive concepts have been described with reference to example embodiments, it will be apparent to those skilled in the art that various changes and modifications may be made without departing from the spirits and scopes of the inventive concepts. Therefore, it should be understood that the above example embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A magnetic memory device comprising:
a magnetic tunnel junction layer comprising: a first magnetic layer; a second magnetic layer; and a first tunnel barrier layer between the first and second magnetic layers,
wherein the first magnetic layer is in direct contact with the first tunnel barrier layer,
wherein the first magnetic layer includes $(Co_xFe_{100-x})_{100-z}Be_z$ where "x" is in a range of 40 to 60 and "z" is in a range of 2 to 15.

2. The magnetic memory device of claim 1, wherein the second magnetic layer includes cobalt-iron-beryllium (CoFeBe), and
wherein a ratio of a cobalt content to an iron content in the first magnetic layer is different from a ratio of a cobalt content to an iron content in the second magnetic layer.

3. The magnetic memory device of claim 2, wherein the second magnetic layer includes $(Co_YFe_{100-Y})_{100-K}Be_K$ where "Y" is in a range of 15 to 35 and "K" is in a range of 2 to 15.

4. The magnetic memory device of claim 2, wherein the second magnetic layer comprises: a first layer containing CoFeBe; and a second layer containing a non-magnetic material, and
wherein the non-magnetic material includes platinum (Pt), palladium (Pd), or tantalum (Ta).

5. The magnetic memory device of claim 4, wherein the first layer is in direct contact with the first tunnel barrier layer, and
wherein the second layer is spaced apart from the first tunnel barrier layer with the first layer interposed therebetween.

6. The magnetic memory device of claim 4, wherein the first layer prevents diffusion of Pt, Pd, or Ta from the second layer.

7. The magnetic memory device of claim 1, wherein the first magnetic layer further includes boron (B), and
wherein a beryllium content of the first magnetic layer ranges from 2 at % to 15 at %.

8. The magnetic memory device of claim 1, further comprising:
a non-magnetic metal layer under the first magnetic layer,
wherein the first magnetic layer is disposed between the non-magnetic metal layer and the first tunnel barrier layer, and
wherein the non-magnetic metal layer includes at least one of Hf, Zr, Ti, Ta, W, Mo, Cr, V, Ru, or any alloy thereof.

9. The magnetic memory device of claim 1, further comprising:
a capping layer spaced apart from the first tunnel barrier layer with the second magnetic layer interposed therebetween,
wherein the capping layer includes a metal oxide.

10. The magnetic memory device of claim 1, wherein the first magnetic layer is a free magnetic layer having a switchable magnetization direction, and
wherein the second magnetic layer is a pinned magnetic layer having a fixed magnetization direction.

11. The magnetic memory device of claim 1, wherein the first magnetic layer is a pinned magnetic layer having a fixed magnetization direction, and
wherein the second magnetic layer is a free magnetic layer having a switchable magnetization direction.

12. The magnetic memory device of claim 1, wherein the magnetic tunnel junction layer further comprises:
a second tunnel barrier layer on the first magnetic layer; and
an additional magnetic layer on the second tunnel barrier layer,
wherein the first magnetic layer is disposed between the first and second tunnel barrier layers.

13. The magnetic memory device of claim 12, wherein the first magnetic layer is a free magnetic layer having a switchable magnetization direction, and
wherein the second magnetic layer and the additional magnetic layer are pinned magnetic layers having fixed magnetization directions.

14. A magnetic memory device comprising:
a magnetic tunnel junction layer comprising: a first magnetic layer; a second magnetic layer; and a first tunnel barrier layer between the first and second magnetic layers,
wherein the first magnetic layer and the second magnetic layer are in direct contact with a bottom surface and a top surface of the first tunnel barrier layer, respectively,
wherein each of the first and second magnetic layers includes cobalt-iron-beryllium (CoFeBe), and
wherein a ratio of a cobalt content to an iron content in the first magnetic layer is different from a ratio of a cobalt content to an iron content in the second magnetic layer.

15. The magnetic memory device of claim 14, wherein an atomic ratio of cobalt:iron in the first magnetic layer ranges from 4:6 to 6:4, and
wherein an atomic ratio of cobalt:iron in the second magnetic layer ranges from 15:85 to 35:65.

16. The magnetic memory device of claim 14, wherein the first magnetic layer is a free magnetic layer having a switchable magnetization direction, and
wherein the second magnetic layer is a pinned magnetic layer having a fixed magnetization direction.

17. The magnetic memory device of claim 14, further comprising:
a non-magnetic metal layer under the first magnetic layer,
wherein the first magnetic layer is disposed between the non-magnetic metal layer and the first tunnel barrier layer, and
wherein the non-magnetic metal layer includes at least one of Hf, Zr, Ti, Ta, W, Mo, Cr, V, Ru, or any alloy thereof.

18. A magnetic memory device comprising:
a substrate; and
a magnetic tunnel junction layer on the substrate, the magnetic tunnel junction layer comprising: a free magnetic layer; a pinned magnetic layer; and a tunnel barrier layer between the free magnetic layer and the pinned magnetic layer,
wherein the free magnetic layer is disposed between the substrate and the tunnel barrier layer and is in direct contact with a bottom surface of the tunnel barrier layer,
wherein the pinned magnetic layer is in direct contact with a top surface of the tunnel barrier layer, and
wherein each of the free and pinned magnetic layers includes cobalt-iron-beryllium (CoFeBe).

19. The magnetic memory device of claim 18, wherein a ratio of a cobalt content to an iron content in the free magnetic layer is different from a ratio of a cobalt content to an iron content in the pinned magnetic layer, and
wherein each of the free and pinned magnetic layers independently has a beryllium content of 2 at % to 15 at %.

20. The magnetic memory device of claim 19, wherein an atomic ratio of cobalt:iron in the free magnetic layer ranges from 4:6 to 6:4, and
wherein an atomic ratio of cobalt:iron in the pinned magnetic layer ranges from 15:85 to 35:65.

* * * * *